(12) United States Patent
Arbab et al.

(10) Patent No.: US 6,398,925 B1
(45) Date of Patent: *Jun. 4, 2002

(54) METHODS AND APPARATUS FOR PRODUCING SILVER BASED LOW EMISSIVITY COATINGS WITHOUT THE USE OF METAL PRIMER LAYERS AND ARTICLES PRODUCED THEREBY

(75) Inventors: Mehran Arbab, Allison Park; James J. Finley, Pittsburgh, both of PA (US)

(73) Assignee: PPG Industries Ohio, Inc., Cleveland, OH (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 3 days.

(21) Appl. No.: 09/215,560

(22) Filed: Dec. 18, 1998

(51) Int. Cl.[7] .............................................. C23C 14/34
(52) U.S. Cl. ........................... 204/192.22; 204/192.15; 204/192.16; 204/192.25
(58) Field of Search ...................... 204/192.15, 192.16, 204/192.22, 192.25; 427/404, 419.3, 419.4

(56) References Cited

U.S. PATENT DOCUMENTS

| | | | |
|---|---|---|---|
| 4,610,771 A | 9/1986 | Gillery | 204/192.1 |
| 4,716,086 A | 12/1987 | Gillery et al. | 428/630 |
| 4,786,563 A | 11/1988 | Gillery et al. | 428/630 |
| 5,318,685 A | 6/1994 | O'Shaughnessy | 204/192.27 |
| 5,480,531 A * | 1/1996 | Weigert et al. | 204/298.13 |
| 5,821,001 A | 10/1998 | Arbab et al. | 428/623 |
| 5,942,338 A * | 8/1999 | Arbab et al. | 428/623 |
| 5,962,115 A | 10/1999 | Zmelty et al. | 428/216 |

FOREIGN PATENT DOCUMENTS

| | | | |
|---|---|---|---|
| EP | 0 464 789 | 1/1992 | C03C/17/36 |
| EP | 0 747 330 | 5/1996 | C03C/17/36 |
| EP | 0 803 481 | 10/1997 | C03C/17/36 |
| GB | 2311540 | 10/1997 | C03C/17/36 |
| JP | 08 171824 | 7/1996 | C01G/19/02 |

OTHER PUBLICATIONS

The Condensed Chemical Dictionary, Sixth Edition by Arthur and Elizabeth Rose, p. 94–95.*
FR 2,050,726 abstract, Mar. 1971.*
Belliard et al., "Doped tin oxides as potential lithium battery negative electrodes", abstract, Institute for Ionics, Mar. 1971.*
Qiu, C. X. et al., "Tin–and Indium–Doped Zinc Oxide Films Prepared by RF Magnetron Sputtering", *Solar Energy Materials 13* (1986), pp. 75–84.
U.S. Patent Application Serial No. 09/058,440, entitled "Silicon Oxynitride Protective Coatings," filed Apr. 9, 1998.

* cited by examiner

Primary Examiner—Steven H. VerSteeg
(74) Attorney, Agent, or Firm—Andrew C. Siminerio; Donald C. Lepiane

(57) ABSTRACT

Methods are presented for depositing an infrared reflective, e.g., silver, containing multi-layer coating onto a substrate to form a coated article. One or more ceramic cathodes are used to deposit a protective layer over the silver layer. The use of the ceramic cathodes eliminates the need for the metal primer layers common in the prior art. Both the infrared reflective layer and a ceramic layer can be deposited in the same coating zone, this coating zone containing sufficient oxygen to provide a substantially oxidized ceramic coating layer without adversely impacting upon the properties of the infrared reflective layer.

18 Claims, 2 Drawing Sheets

METHODS AND APPARATUS FOR PRODUCING SILVER BASED LOW EMISSIVITY COATINGS WITHOUT THE USE OF METAL PRIMER LAYERS AND ARTICLES PRODUCED THEREBY

BACKGROUND OF THE INVENTION

1. Field of the Invention

The invention relates generally to the field of magnetron sputtering vacuum deposition and, more particularly, to sputtering a multi-layer coating stack having an infrared reflective metal layer without overlaying metal primer layers and also relates to the article made thereby.

2. Description of the Presently Available Technology

Sunlight contains light energy which falls generally into three broad regions: ultraviolet, visible and infrared. For many commercial applications, such as the windows of buildings or automobile windows, it is desirable to reduce the amount of energy, i.e., heat, transferred through the window into and/or out of the building or automobile. This heat reduction can be affected by reducing the transmitted light energy from any of these three regions. However, it is typically not practical to remove too much visible light energy, as this adversely impacts upon the ability of persons to see through the window. It is therefore desirable to block out as much of the remaining energy, such as infrared energy, as possible since this will result in the largest reduction of transmitted energy without adversely impacting upon visible light transmittance.

To reduce solar infrared energy transmittance, it is known to deposit infrared reflective metal layers, such as silver, gold, aluminum or copper, on a glass substrate. However, if only an infrared reflective metal were applied, this would result in a mirror-like finish which would also reflect visible light. Therefore, an antireflective layer is usually provided on one or both sides of the infrared reflective layer to produce a substrate which is highly reflective of infrared energy but which is also highly transmissive of visible energy. These antireflective layers are usually formed of a dielectric material, e.g., metal oxides, such as $Zn_2SnO_4$, $In_2SnO_4$, $TiO_2$, $SnO_2$, $In_2O_3$, $ZnO$, $Si_3N_4$ or $Bi_2O_3$ to name a few.

The infrared reflective and antireflective layers are typically formed on the glass substrate in a cathode sputtering coater using a technique known in the sputtering art as magnetron sputtering vacuum deposition. The antireflective layer is usually deposited over the substrate by sputtering a metal or metal alloy cathode in a reactive atmosphere, e.g., an oxygen rich atmosphere, to deposit a metal oxide dielectric coating over the glass substrate surface. A cathode made of an infrared reflective metal, such as silver, is sputtered in a non-reactive, e.g., oxygen-free, inert, atmosphere such as argon to deposit an infrared reflective metal layer over the antireflective layer. The oxygen-free atmosphere is used to deposit a metal layer and to prevent oxidation of the infrared reflective metal cathode. To prevent the breakdown of the silver layer by oxidation or agglomeration during the sputtering of a subsequent antireflective layer, a protective metal primer layer, such as copper, niobium, titanium, tantalum, chromium, tungsten, zinc, indium, nickel-chromium alloys or similar metal, is deposited over the silver layer.

An example of the formation of such metal primer layers is disclosed in U.S. Pat. No. 5,318,685, which disclosure is herein incorporated by reference. These metal primer layers are typically on the order of about 10–30 Angstroms thick and are sacrificial. That is, the thickness of the metal primer layers is determined based upon the system coating parameters so that most of the metal primer layer is reacted, i.e., oxidized, during the sputtering of the subsequent antireflective layer. The protective metal primer layer becomes transparent when completely oxidized so that the oxidized metal primer layer does not adversely impact upon the light transmittance and reflective qualities of the coated substrate. However, this subsequent oxidation of the metal primer layer is not easily controlled and it is not unusual for this oxidation to be less than complete. Further, metal atoms from some metal primers tend to alloy with the metal of the infrared reflective metal layer which degrades the interface between the two layers.

While generally acceptable for producing low emissivity coated substrates, there are drawbacks associated with conventional coating methods. For example, for a coated glass which is to be used without further thermal processing or conditioning, if not all of the metal primer layer is oxidized during application of the subsequent antireflective layer, the residual metal primer layer causes a decrease in visible light transmission. Additionally, the amount and thickness of the residual metal primer layer left after application of the subsequent antireflective layer has an effect on the physical properties of the coating, such as the hardness of the coated substrate. Therefore, it is important to apply only as much of the metal primer layer as will be oxidized during sputtering of the subsequent antireflective layer. However, controlling the thickness of the metal primer layer to such a required degree of accuracy, e.g., 10–30 Å, poses a significant process complexity. Accurate thickness control within e.g., an atomic layer is difficult. Also, controlling the oxidation of the metal primer layer is difficult. In addition to the limitations with incomplete oxidation of the primer layer, with conventional coaters, valuable coating space is wasted because of the need for having discrete oxygen-free infrared reflective metal coating zones separate from the oxygen containing antireflective coating zones.

Additionally, if the coated substrate is to be further heat treated, such as for bending, heat strengthening or tempering, the thickness of the metal primer layer must be increased during processing to leave sufficient unoxidized residual metal primer for protection of the silver layer during such subsequent heat treatment. This means that for commercial purposes, two inventories of the coated substrate must usually be maintained, one having a relatively thin, oxidized primer layer capable of immediate use and one having a relatively thicker primer layer with unoxidized metal primer for use after further heat treatment. However, it is not unusual for the coating properties, such as color, transmission and haze, to be adversely affected by subsequent heat treatment of conventional low emissivity coated substrates with even thicker primer layers.

As can now be appreciated by those skilled in the art, it would be advantageous to provide a coating having one or more infrared reflective metal layers without the need of conventional metal primer layers and a method of making same.

SUMMARY OF THE INVENTION

A coated article, e.g., an automotive transparency, e.g. windshield or architectural window, made in accordance with the invention has a substrate with an infrared reflective metal layer, for example, a silver layer, deposited over the substrate and a ceramic layer, e.g., an aluminum doped zinc oxide layer, deposited preferably from a ceramic cathode over the silver layer. Additional antireflective or ceramic layers may be deposited below the infrared reflective metal layer or over the ceramic layer.

The invention provides a method of sputtering a multi-layer coating stack having an infrared reflective metal, e.g., silver, over a substrate by sputtering an infrared reflective metal cathode to deposit an infrared reflective layer over the substrate and then sputtering a ceramic cathode, such as an aluminum doped zinc oxide cathode, to deposit a non-sacrificial, ceramic layer over the silver layer. The silver layer and the ceramic layer may each be sputtered in an inert atmosphere containing a low percentage of oxygen, for example, in the same coating chamber of a coater with the oxygen content controlled in a manner to be described to a level to minimize undesired effects on the silver layer. For example, the oxygen content can be regulated to be about 0–20 vol. % to prevent the resistivity of the silver layer from increasing to a non-preferred level, e.g., increasing by an amount equal to about 75% or more of the resistivity of a silver layer of similar thickness sputtered in an inert, non-reactive atmosphere. Additional ceramic or antireflective layers can be deposited below the silver layer or over the ceramic layer.

A coater is also provided for sputtering a multi-stack coating having an infrared reflective metal, e.g., silver, onto a substrate. The coater includes an infrared reflective metal cathode with at least one ceramic cathode located downstream and preferably spaced from and adjacent to the infrared reflective metal cathode. The infrared reflective metal cathode and the ceramic cathode may be located in the same coating zone.

DESCRIPTION OF THE PREFERRED EMBODIMENTS

Figure 1:
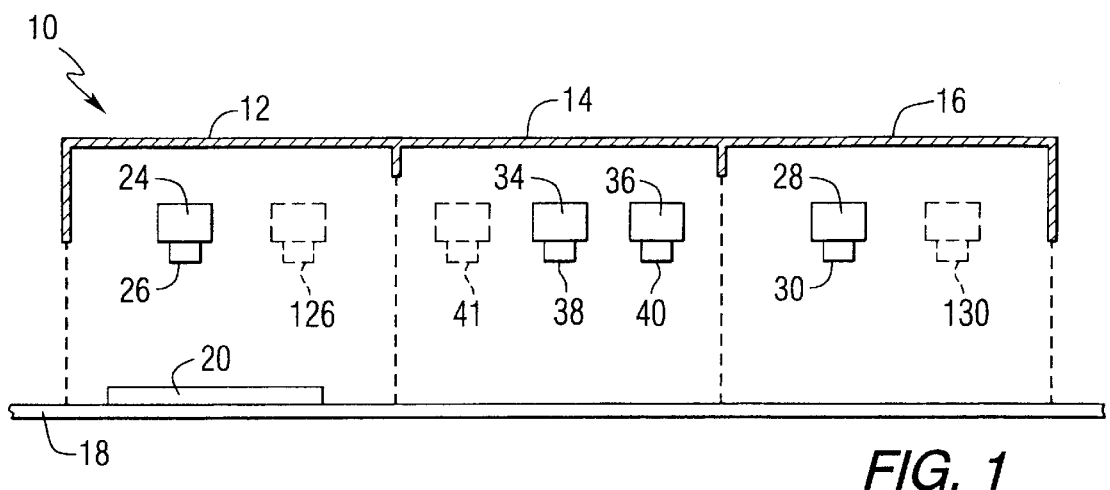
FIG. 1 is a side, fragmented view of a coater having the sidewall removed for purposes of clarity and utilizing the principles of the invention.

For purposes of the description hereinafter, the terms "above", "below", "right", "left", "top", "bottom", and similar spatial indicators shall relate to the invention as it is oriented in the figures. However, it is to be understood that the invention may assume various alternative variations and step sequences, except where expressly specified to the contrary. It is also to be understood that the specific coater and coating processes illustrated in the attached drawings, and described in the following specification, are simply exemplary embodiments of the invention. Hence, specific dimensions and other physical characteristics related to the embodiments disclosed herein are not to be considered as limiting. The term "ceramic" used herein refers generally to materials comprising compounds of metallic and non-metallic elements and the term "ceramic layer" refers to a layer deposited from a "ceramic" cathode. The term "over" means above but not necessarily adjacent to or in contact with.

In order to fully appreciate the coating method and resulting coated article, a coater utilizing the features of the invention will first be described. The coater is designated 10 in FIG. 1 and includes a first coating zone 12, a second coating zone 14 and a third coating zone 16. A conveyor 18 is configured to move a substrate 20 to be coated through the zones 12, 14, and 16 at a selected speed. The substrate may be made of any material, for example, but not limiting to the invention, plastic, clear or tinted glass, metal, glass ceramic. The zones 12, 14 and 16 are isolated from one another in any usual manner, e.g., by structurally separate stages or inter-stages having turbo molecular or diffusion pumps to help prevent gasses from one zone diffusing into an adjacent zone as indicated by dashed lines in FIG. 1.

The first zone 12 includes one or more cathode holders 24 for receiving a cathode target 26 for sputtering. The third zone 16 is similar to the first zone 12 and includes one or more cathode holders 28 for receiving one or more cathode targets 30.

In one embodiment of the invention, the second zone 14 has two cathode holders 34 and 36, each holding a cathode target 38 and 40, respectively. For ease of discussion, the cathode targets will simply be referred to as "cathodes" hereinafter. The cathode 38 is a conventional infrared reflective metal cathode, such as silver, gold, etc. The other cathode 40 is a conductive ceramic cathode incorporating features of the invention, for example, a metal oxide which is conductive or is doped to be conductive, e.g., an aluminum doped zinc oxide cathode available from the Cerac Company of Milwaukee, Wis. The ceramic cathode 40 is used instead of the metal primer cathode of the prior art.

Methods of sputtering a multi-layer coating stack in accordance with the features of the invention will now be discussed. For purposes of initial discussion, and not to be considered as limiting to the invention, the cathodes 26 and in the first and third zones 12 and 16 may be conventional metal cathodes, e.g., zinc cathodes and/or zinc and tin alloy cathodes, of the type discussed in U.S. Pat. No. 4,610,771, which disclosure is herein incorporated by reference, or zinc cathodes or silicon cathodes of the type used in the art to deposit an antireflective layer, e.g., as disclosed in U.S. patent application Ser. No. 09/058,440 entitled "Silicon Oxynitride Protective Coatings" filed on Apr. 9, 1998, the disclosure of which is herein incorporated by reference. In this instance, the first and third zones 12 and 16 will contain conventional reactive, e.g., oxygen rich, atmospheres. The infrared reflective cathode 38 may be a silver cathode and the ceramic cathode 40 may be an aluminum doped zinc oxide cathode.

The substrate 20, e.g., a glass sheet, is moved by the conveyor 18 into the first coating zone 12 and the cathode 26, e.g., a zinc and tin alloy cathode, is energized. A zinc stannate layer is deposited over the substrate 20 in a conventional manner. The zinc stannate layer preferably has a thickness of about 20–1000 Å, preferably 100–400 Å, most preferably 200–350 Å.

The zinc stannate coated substrate 20 is moved by the conveyor 18 into the second coating zone 14 and under the energized cathode 38. An infrared reflective layer, e.g., preferably a silver layer of about 80–150 Å, is deposited over the zinc stannate layer from the silver cathode 38 in conventional manner. After the silver layer is deposited, the ceramic, aluminum doped zinc oxide cathode 40 is sputtered to deposit an aluminum doped zinc oxide layer onto the silver layer. As can be appreciated, some or all of the cathodes may be continuously energized during the deposition process or cathodes may be energized prior to deposition and deenergized after the deposition. As described in more detail below, the atmosphere for sputtering the ceramic cathode 40 may contain oxygen, e.g., 0–20 vol. %. When the ceramic cathode 40 is sputtered with the plasma, zinc, aluminum and oxygen atoms are ejected from the ceramic cathode 40 either separately or as multi-atom species. These atoms recombine on the substrate 20 to form a ceramic, e.g., aluminum doped zinc oxide, layer over the silver layer. When used as a protective layer, the minimum amount of ceramic material applied should be that to give uniform coverage over the silver to prevent breakdown when the subsequent antireflective layer is sputtered and the maximum amount is generally limited by the economics of the coating process and may, for example, be on the order of about 20–100 Å, preferably about 30–80 Å and more preferably about 40–50 Å without adversely impacting the coating properties. The method of the invention reduces or eliminates the metal to metal alloying problem associated with the metal primer layers of the prior art as previously discussed.

While the above description focuses on the use of aluminum doped zinc oxide as the preferred ceramic material, other conductive ceramic materials that produce highly transparent layers at low oxygen fractions in the working gas may also be used. For example and not to be considered as limiting to the invention, the ceramic cathode material may include tin oxide, indium oxide and/or zinc oxide with dopants such as indium, zinc, antimony, cadmium and/or fluorine added to form conductive ceramic cathodes such as zinc stannate, antimony doped tin oxide, cadmium stannate, fluorine doped tin oxide, indium doped tin oxide, tin doped indium oxide and indium doped zinc oxide.

In conventional sputter coating processes, the infrared reflective metal layer and the metal primer layer are deposited in an oxygen-free atmosphere to prevent breakdown of the silver layer by oxidation. However, it has been determined that sputtering an oxygen containing ceramic cathode in an oxygen-free atmosphere may result in the loss of oxygen from the sputtered ceramic material to the gas phase. This oxygen may then be pumped away by the diffusion pumps of the interstages. Additionally, some of the oxygen from the ceramic cathode material may react with coating material deposited on the walls or other free surface areas of the coater to reduce the total amount of oxygen available for forming the ceramic layer. Therefore, the resulting ceramic layer, such as an aluminum doped zinc oxide layer, deposited over the silver in an oxygen-free atmosphere may have a higher metal e.g. zinc and aluminum to oxygen ratio than stoichiometric. In order to counter this loss of oxygen, a small amount, for example, greater than 0 and less than 20 vol. %, preferably 3–10 vol. %, of oxygen may be used in the sputtering atmosphere in the second zone 14. This small amount of oxygen in the zone atmosphere has a negligible effect on the deposition rate and properties of the silver during sputtering, however, this small amount of oxygen results in a substantially completely oxidized ceramic layer, e.g., having a substantially stoichiometric metal to oxygen ratio, over the silver layer. The oxygen content should be regulated to prevent an increase in the resistivity of the silver layer by more than an amount equal to about 75% of the resistivity of a silver layer of similar thickness sputtered in an inert, e.g., argon, atmosphere, preferably by an amount less than about 50%, more preferably by an amount less than about 30% and most preferably 0% i.e. no change. As will be appreciated by one of ordinary skill in the art, the resistivity of the silver layer varies with the thickness of the silver layer. A discussion of the relationship between resistivity and film thickness is provided in Materials Research Society Bulletin, Volume XXII, Number 9, September 1997, the disclosure of which is herein incorporated by reference. For example, for a silver layer deposited on an amorphous zinc stannate base layer, the resistivity varies from about 10.75 $\mu\Omega$ cm at a thickness of about 60 to a resistivity of about 4.5 $\mu\Omega$ cm at a thickness of about 300 Å. Therefore, for example and not to be considered as limiting to the invention, for a 60 Å thick silver layer deposited on an amorphous zinc stannate layer in accordance with the teachings of the invention, the amount of oxygen added should preferably not result in an increase in resistivity of the silver layer by an amount of more than 8.1 $\mu\Omega$ cm (0.75×10.75 $\mu\Omega$ cm), i.e., a final resistivity of 18.85 $\mu\Omega$ cm, preferably by not more than 5.4 $\mu\Omega$ cm (0.5×10.75 $\mu\Omega$ cm) and more preferably by not more than 3.2 $\mu\Omega$ cm (0.30×10.75 $\mu\Omega$ cm), and most preferably no change i.e. 0 $\mu\Omega$ cm in the silver layer.

The aluminum doped zinc oxide layer over the silver layer protects the silver layer during subsequent sputter deposition of the second dielectric layer in the third zone 16. Additionally, while energized the ceramic cathode 40 acts as a scavenger for oxygen which may diffuse into the second zone 14 from the first and third zones 12 and 16, i.e., this diffused oxygen can combine with the sputtered cathode material to help form the ceramic layer. In that regard, another ceramic cathode, cathode 41 shown in phantom in FIG. 1, may be operationally positioned upstream of the silver cathode 38 to scavenge oxygen on the upstream side of the silver cathode 38. After the ceramic layer is deposited, the conveyor 18 moves the substrate into the third zone 16 where a zinc stannate layer is deposited over the ceramic layer in conventional manner. As shown in FIG. 1, additional cathodes 126 and 130 shown in phantom in the first and third zones 12 and 16, respectively, may be present. For example, the cathodes 126 and 130 may be zinc cathodes to deposit a zinc oxide layer, over the adjacent zinc stannate layer and under the adjacent silver layer of the coating.

Figure 2:
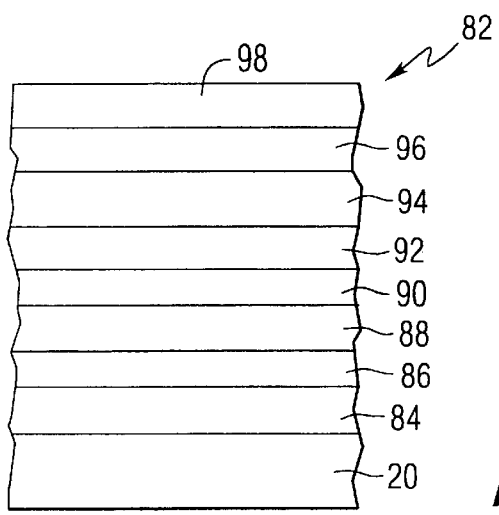
FIG. 2 is a side view of a substrate having a multi-layer coating incorporating features of the invention.

The substrate 18 can then be moved into other zones similar to zones 12, 14 and 16 for the application of additional coating layers to produce, for example, a mechanically durable multi-layered coated substrate structure 82 of the type shown in FIG. 2.

The coated substrate structure 82 has a first antireflective layer 84, which may include one or more different types of antireflective materials or one or more films of different antireflective materials, e.g., a zinc oxide layer over a zinc stannate layer; a first infrared reflective metal, e.g., silver, layer 86; a first ceramic, e.g., aluminum doped zinc oxide, layer 88; a second antireflective layer 90, which may include one or more different types of antireflective materials or one or more films of different antireflective materials, e.g., a zinc oxide layer over a zinc stannate layer; a second silver layer 92; a second aluminum doped zinc oxide layer 94; a third antireflective layer 96, which may include one or more different types of antireflective materials or one or more films of different antireflective materials, e.g., a zinc oxide layer over a zinc stannate layer; and a protective overcoat 98 of the type known in the art, e.g., a titanium oxide layer or graded silicon oxynitride layer. Reference may be had to U.S. Pat. No. 5,821,001 for examples of multiple films in an antireflective layer and to U.S. Pat. Nos. 4,716,086 and 4,786,563 for examples of protective overcoats, the disclosures of which are herein incorporated by reference. The aluminum doped zinc oxide layers of the instant invention provide improved physical and optical characteristics and eliminate or reduce the problems associated with presently used metal primer layers.

Since the aluminum doped zinc oxide layer is transparent and has a similar refractive index to conventional dielectric materials, such as zinc stannate, the thickness of the aluminum doped zinc oxide layer is generally not critical in forming transparent coatings, i.e., the properties of the coated substrate are not typically adversely affected by the thickness of the aluminum doped zinc oxide layer. The transmittance and reflectivity components of the coated glass substrate are not adversely affected, as they would be with the prior art metal protective layer. However, the total thickness of the aluminum doped zinc oxide layer and adjacent antireflective layer will have to be controlled to maintain a desired optical thickness, e.g., if the thickness of the aluminum doped zinc oxide layer is increased, the thickness of the adjacent antireflective layer will have to be decreased to maintain the desired optical thickness for a particular desired color. If the refractive index of the aluminum doped zinc oxide layer is substantially different from that of the adjacent dielectric layer, the thicknesses of these layers may have to be adjusted to maintain a desired optical thickness for a desired color. Conventional optical monitors (not shown) may be present in the coater 10 to permit the thickness of the coating layers to be monitored and controlled.

Additionally, the aluminum doped zinc oxide layer enhances the physical properties of the coated substrate, such as hardness. Further, a substrate utilizing an aluminum doped zinc oxide layer of the invention instead of a conventional primer layer may be subsequently heat treated, e.g., to bend, temper or heat strengthen the coated glass substrate. Since the transmission of the ceramic primer layer of the instant invention does not significantly change upon heating as compared to a coating including a thick metal primer layer, one coated substrate can be used for both heated and non-heated applications, eliminating the requirement of separate inventories of coated substrates necessitated with prior art systems. As can be appreciated, in the instance where the ceramic primer layer is substoichiometric, heating the ceramic primer layer is expected to make the composition more oxidized changing the transmittance of the ceramic primer layer and therefore changing the transmittance of the coated article.

While in the process described above the cathodes 26 and 30 in the first and third zones 12 and 16, respectively, were conventional zinc and tin alloy cathodes, one or both of these cathodes 26 and 30 could be a ceramic, e.g., aluminum doped zinc oxide cathode to replace the conventional antireflective layers 84, 90 with aluminum doped zinc oxide layers.

EXAMPLE

Samples were made to study the effects of depositing an aluminum doped zinc oxide layer from a ceramic cathode onto a glass substrate and also onto a multi-stack coated substrate. All of the samples discussed below were made with a conventional Airco ILS 1600 deposition system utilizing a system pressure of about 4 mTorr and power settings between 0.5–1.5 kW. Deposition parameters and results for the deposition of an aluminum doped zinc oxide layer onto a glass substrate and also for the deposition of a silver containing low emissivity coating with aluminum doped zinc oxide primers on a glass substrate are shown in Tables 1 and 2, respectively.

The samples reported in Table 1 were prepared by depositing an aluminum doped zinc oxide layer directly onto clear float glass substrates twelve inches (30.48 cm) square and 0.09 inch (2.3 mm) thick in a conventional manner, i.e., by successively passing the substrate under the cathode during coating.

Figure 3:
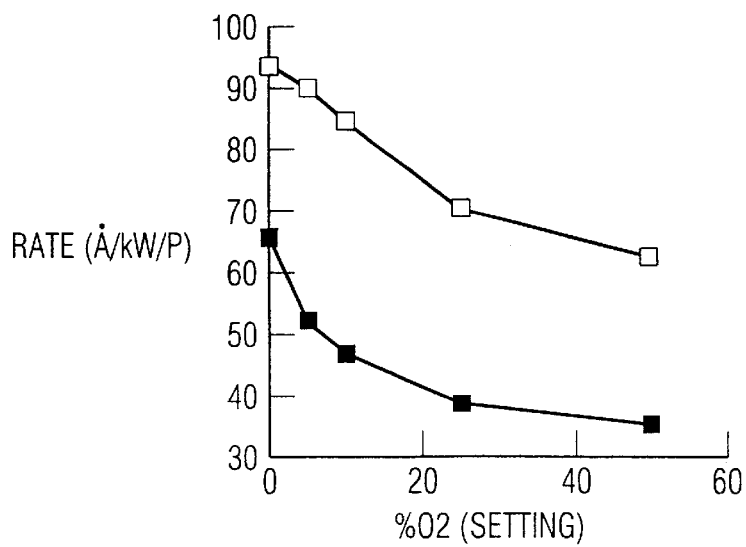
FIG. 3 is a graph of deposition rate versus percent oxygen for the experiments disclosed in Table 1.
Figure 4:
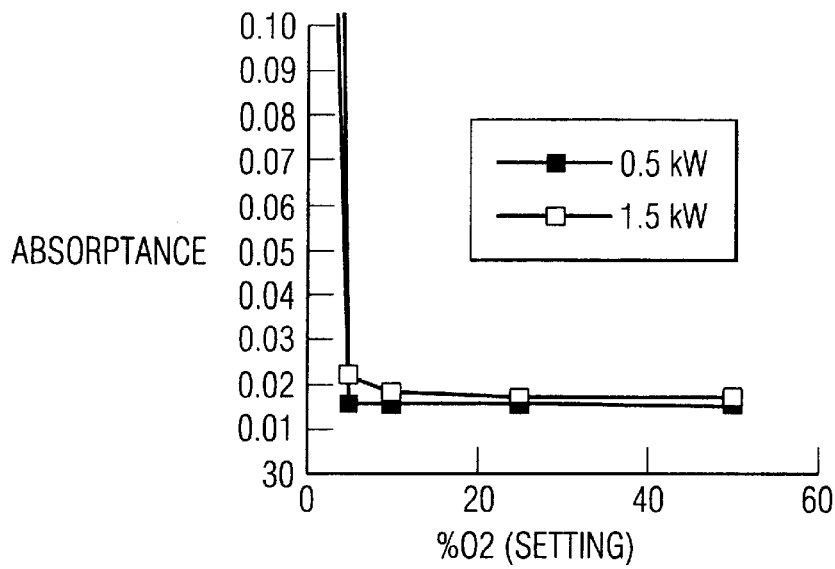
FIG. 4 is a graph of absorptance versus percent oxygen for the experiments disclosed in Table 1.

FIG. 3 shows a plot of deposition rate versus oxygen percentage in the total glass flow for preparation of these samples. The two sets of data correspond to different deposition power levels for the Airco ILS 1600 deposition system. FIG. 4 shows the absorptance of thin films of the same materials with thicknesses of about 500–1800 Angstroms. In pure argon, the absorptance of the deposited ceramic layer is high, indicating that the layer is a highly reduced material. However, if 5% or more of oxygen is added to the zone or sputtering chamber, the absorptance of the layer is sharply decreased (FIG. 4) while the drop in deposition rate (FIG. 3), by comparison, is small. Interestingly, as shown in FIGS. 3 and 4, higher levels of oxygen which result in even lower deposition rates do not result in lower levels of absorptance, i.e., with a very small level of oxygen in the gas flow the deposited film is essentially fully oxidized.

TABLE 1

| Sample No. | % $O_2$ | Power (kW) | Transmittance LTD65 | First Surface Reflectance (YR1) | Absorptance | Å | Rate Å/kW/P |
|---|---|---|---|---|---|---|---|
| 1 | 0 | 0.5 | 0.5384 | 0.1875 | 0.2741 | 654 | 65.4 |
| 2 | 5 | 0.5 | 0.7909 | 0.1935 | 0.0156 | 521 | 52.1 |
| 3 | 10 | 0.5 | 0.8002 | 0.1845 | 0.0153 | 466 | 46.6 |
| 4 | 25 | 0.5 | 0.8202 | 8.1645 | 0.0153 | 386 | 38.6 |
| 5 | 50 | 0.5 | 0.8331 | 0.1525 | 0.0144 | 352 | 35.2 |
| 6 | 0 | 1.0 | 0.3818 | 0.1326 | 0.4856 | 1872 | 93.6 |
| 7 | 5 | 1.0 | 0.8185 | 0.1596 | 0.0219 | 1800 | 90 |
| 8 | 10 | 1.0 | 0.8473 | 0.1346 | 0.0181 | 1693 | 84.65 |
| 9 | 25 | 1.0 | 0.8946 | 0.0889 | 0.0165 | 1405 | 70.25 |
| 10 | 50 | 1.0 | 0.8722 | 0.1109 | 0.0169 | 1246 | 62.3 |

TABLE 2

| Sample No. | % $O_2$ | Emissivity | Resistance ohm/sq. | % T LTD65 | Shear Resistance | Tape | Haze |
|---|---|---|---|---|---|---|---|
| 11 | 5 | 0.045 | 2.67 | 79.35 | C+ | P | A+ |
| 12 | 10 | 0.05 | 2.6 | 79.04 | A+ | P | A+ |
| 13 | 20 | 0.065 | 4.3 | 73 | A+ | P | A+ |
| 14 | 30 | 0.12 | 8.22 | 63.11 | A– | P | — |
| 15 | 3 | 0.045 | 2.64 | 79.33 | A+ | P | A+ |

Figure 5:
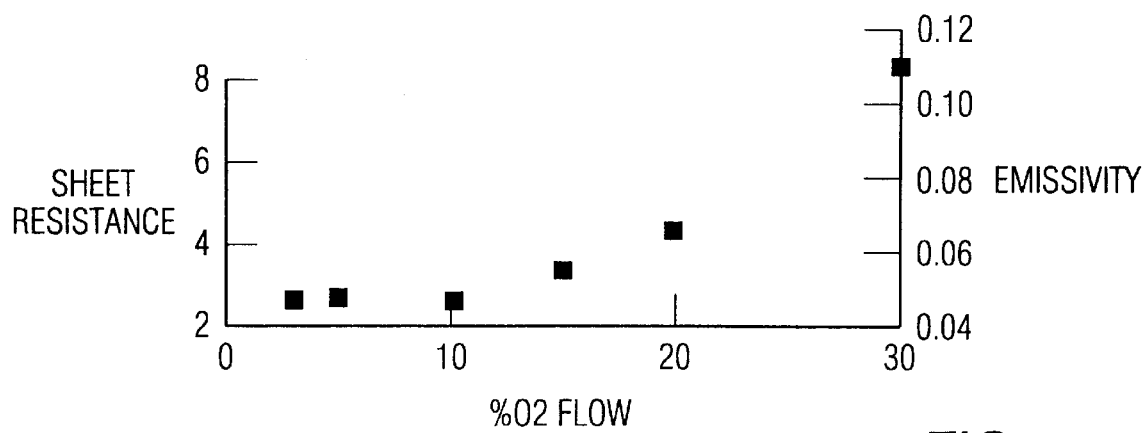
FIG. 5 is a graph of sheet resistance and emissivity versus percent oxygen for the experiments disclosed in Table 2.
Figure 6:
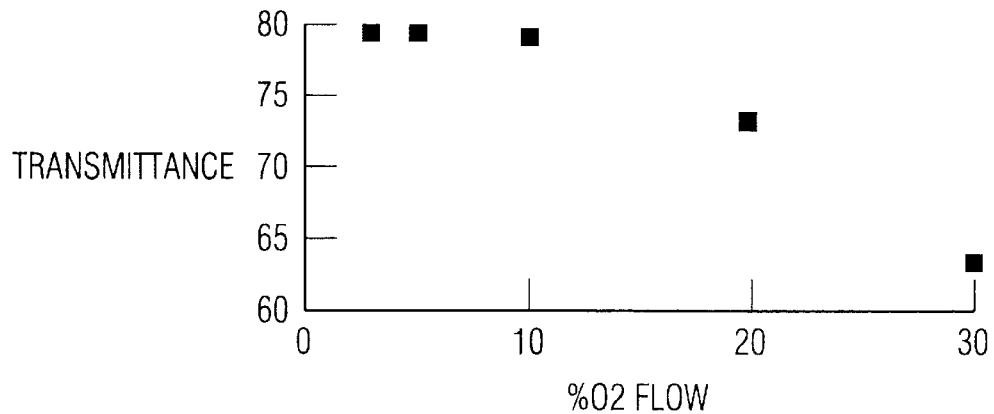
FIG. 6 is a graph of transmittance versus percent oxygen for the experiments disclosed in Table 2.

The results reported in Table 2 are for multi-stack coatings deposited on clear float glass substrates twelve inches (30.48 cm) square and 0.09 inch (2.3 mm) thick. The coating stack comprised a first zinc stannate layer deposited directly on the clear float glass substrate; a first silver layer deposited on the first zinc stannate layer; a first aluminum doped zinc oxide layer deposited from a ceramic cathode onto the first silver layer; a second zinc stannate layer deposited on the first aluminum doped zinc oxide layer; a first zinc oxide layer deposited on the second zinc stannate layer; a second silver layer deposited on the first zinc oxide layer; a second aluminum doped zinc oxide layer deposited from a ceramic cathode onto the second silver layer; a second zinc oxide layer deposited on the second aluminum doped zinc oxide layer; and a titanium oxide overcoat deposited on the second zinc oxide layer. Shear resistance, tape and haze tests were performed on the coated substrates in conventional manner and the results are shown in Table 2. For example, the tape test is conducted by applying a piece of Scotch brand tape onto the coating surface, pressing the tape by hand against the coating and then pulling the tape off to visually determine whether the coating has delaminated. If there is no delamination, a passing (P) grade is recorded and if there is delamination, a failing grade (F) is recorded. The haze test was also a visual test to qualitatively determine the amount of coating haze from $A^+$ (meaning no haze) to a $D^-$ (very hazy). The shear resistance test was conducted by stroking the coated substrate twenty times with a damp cloth followed by a visual rating from $A^+$, meaning high shear resistance, to $D^-$, meaning low shear resistance. In Sample No. 14 of Table 2, at 30% oxygen the coating layer was highly broken down and therefore no haze result was recorded. Examples of such tests are described in the previously cited U.S. Pat. No. 5,821,001. From the above results, for an Airco ILS 1600 chamber utilizing a total working gas pressure of 4 mTorr and a cathode power of 0.5–1.5 kW, the preferred region for sputtering a non-absorbing aluminum doped zinc oxide cathode appears to be between about 3–10 vol. % oxygen, preferably about 3–5 vol. % oxygen. However, as will be appreciated by one of ordinary skill in the art, this range could differ for other coaters or for other pressures or power settings. As shown in FIGS. 5 and 6, a minimum emissivity of 0.045 can be obtained with about 3–5 vol. % oxygen. This compares favorably with reproducible emissivity of 0.05 for coatings where conventional titanium primer layers are used. Similarly, in this range of partial oxygen flow, maximum coating conductivity and transmittance are observed. Conversely, the above coating characteristics are progressively degraded as the amount of oxygen in the gas is increased. The optimum range of oxygen concentration corresponds to the range where the deposition rate of the fully oxidized aluminum doped zinc oxide is highest. For the Airco ILS 1600 system described above, the optimum oxygen content was found to be between about 3–5 vol. %. This optimal range may vary with other model systems. Preferably, as discussed above, the amount of oxygen should not result in an increase in resistivity of the silver layer. Referring to FIG. 5, in this system, this corresponds to an oxygen presence of 10 vol. % or lower. However, as also shown in FIG. 5, an oxygen presence of up to 20 vol. % still results in a coating with an acceptable level of emissivity. However, as discussed above, the maximum amount of oxygen should not be more than that producing about a 30%–75% increase in the resistivity of the silver layer for a given thickness calculated with respect to a silver layer of similar thickness sputtered in an inert, e.g., argon, atmosphere.

In the instance that a stable but absorbing primer layer is desired e.g. for a low emissivity and/or low shading coefficient coated product, the ceramic cathode may be sputtered in an inert atmosphere or an atmosphere containing less than about 3% reactive gas e.g. oxygen to provide a substoichiometric optically absorbing ceramic primer layer. As used in the discussion of the instant invention, a stable layer is a layer that does not chemically change during normal use of the coated product having the stable layer and is expected to change when the stable layer is heated during manufacture of the final product.

In an alternative embodiment of the invention, the cathodes 26 and 30 in the first and third zones 12 and 16 may be replaced with ceramic, for example, aluminum doped zinc oxide, cathodes. The cathode holder 36 and cathode 40 in the second zone 14 may be eliminated. The amount of oxygen in the first and third zones 12 and 16 may be controlled as described above such that ceramic layers deposited from the cathodes 26 and 30 are substantially completely oxidized. Thus, a ceramic layer, e.g., an aluminum doped zinc oxide layer, may be deposited both under and over the silver layer.

Additional silver and ceramic layers may be applied to form a multi-layered stack. In this embodiment of the invention, the ceramic, e.g., aluminum doped zinc oxide is utilized not only as a protective layer for the silver layer but also comprises all of the antireflective layers. By reducing the number of cathode positions, the complexity of the coater can be reduced over that required for prior art coaters.

Although the preferred embodiments of the coaters described above were continuous coaters, the principles of the invention are applicable to other coater types, such as batch coaters. Further, the antireflective and infrared reflective metals can be of any conventional type, such as those described above.

Although the above discussion was directed to depositing a ceramic layer over an infrared reflective metal layer, as can be appreciated by one of ordinary skill in the art, the invention may be practiced to prevent oxidation of an underlying layer of various materials, not just infrared reflective metal layers.

It will readily be appreciated by those skilled in the art that modifications may be made to the invention without departing from the concepts disclosed in the foregoing description. Such modifications are to be considered as included within the scope of the following claims unless the claims, by their language, expressly state otherwise. Accordingly, the particular embodiments described in detail hereinabove are illustrative only and are not limiting as to the scope of the invention, which is to be given the full breadth of the appended claims and any and all equivalents thereof.

We claim:

1. A method of forming a coated article, comprising the steps of:
   sputter depositing a metal layer over a substrate, and
   sputtering a conductive ceramic cathode in a controlled atmosphere to deposit a metal doped metal oxide layer defined as a ceramic layer over the metal layer.

2. The method as claimed in claim 1, wherein the metal layer is selected from the group consisting of silver, gold, aluminum and copper.

3. The method as claimed in claim 1, wherein the ceramic layer is selected from the group consisting of indium doped tin oxide, zinc doped tin oxide, antimony doped tin oxide, cadmium doped tin oxide, tin doped indium oxide and indium doped zinc oxide.

4. The method as claimed in claim 1, wherein the ceramic layer is an aluminum doped zinc oxide layer.

5. The method as claimed in claim 1, including heating the coated article to bend, temper or heat strengthen the coated article.

6. The method as claimed in claim 1, including:
   sputter depositing a first zinc stannate layer over the substrate;
   sputter depositing a first zinc oxide layer over the first zinc stannate layer;
   practicing the step of sputter depositing a metal layer to deposit the metal layer over the first zinc oxide layer;
   practicing the step of sputtering a ceramic target to deposit the ceramic layer over the metal layer;
   sputter depositing a second zinc stannate layer over the ceramic layer;
   sputter depositing a second zinc oxide layer over the second zinc stannate layer;

sputter depositing a second metal layer over the second zinc oxide layer;

sputter depositing a second ceramic layer over the second metal layer;

sputter depositing a third zinc stannate layer over the second ceramic layer; and sputter depositing a protective overcoat over the third zinc stannate layer.

7. The method as claimed in claim 1, including:

sputter depositing a first zinc stannate layer on the substrate;

sputter depositing a ceramic layer defined as a first ceramic layer on the first zinc stannate layer;

practicing the step of sputter depositing a metal layer to deposit the metal layer on the first ceramic layer;

practicing the step of sputtering a ceramic target to deposit the ceramic layer defined as a second ceramic layer over the metal layer;

sputter depositing a second zinc stannate layer on the second ceramic layer;

sputter depositing a third ceramic layer on the second zinc stannate layer;

sputter depositing a second metal layer on the third ceramic layer;

sputter depositing a fourth ceramic layer on the second metal layer;

sputter depositing a third zinc stannate layer on the fourth ceramic layer; and sputter depositing a protective overcoat on the third zinc stannate layer.

8. The method as claimed in claim 1, including sputter depositing an antireflective layer over the ceramic layer.

9. The method as claimed in claim 1, wherein the ceramic layer is a first ceramic layer and the method includes sputter depositing a second ceramic layer over the substrate and sputter depositing the metal layer over the second ceramic layer.

10. The method as claimed in claim 1, including sputter depositing an antireflective layer over the substrate and depositing the metal layer over the antireflective layer.

11. The method as claimed in claim 10, wherein the antireflective layer is selected from the group consisting of zinc stannate, indium tin oxide, titanium oxide, tin oxide, indium oxide, zinc oxide, silicon nitride and bismuth oxide.

12. The method as claimed in claim 1, wherein the step of depositing the metal layer includes depositing an infrared reflective metal layer.

13. The method as claimed in claim 12, wherein the ceramic layer is a first ceramic layer, the method including the steps of:

sputter depositing a second ceramic layer over the substrate;

sputter depositing the infrared reflective metal layer over the second ceramic layer, and practicing the step of sputtering a ceramic target to deposit the first ceramic layer over the infrared reflective metal layer.

14. The method as claimed in claim 12, including:

sputter depositing a first antireflective layer over the substrate;

sputter depositing the infrared reflective layer over the first antireflective layer;

practicing the step of sputtering a ceramic target to deposit the ceramic layer over the infrared reflective layer; and sputter depositing a second antireflective layer over the ceramic layer.

15. The method as claimed in claim 14, wherein the steps of depositing the infrared reflective layer and depositing the ceramic layer are practiced in the same coating zone.

16. The method as claimed in claim 1, wherein the steps of depositing the metal layer and the ceramic layer are practiced in the same coating zone and the method further includes the step of adding sufficient oxygen to the coating zone to substantially fully oxidize the ceramic layer during the practice of at least one of the depositing steps.

17. The method as claimed in claim 16, including controlling the oxygen content in the coating zone such that the oxygen content is about 0–20 vol. %.

18. The method as claimed in claim 16, wherein the metal layer is a silver layer and the method includes controlling the oxygen in the coating zone such that the conductivity of the silver layer is not reduced below 50% of that for a silver layer sputtered in an argon atmosphere.

* * * * *